United States Patent
Jeong et al.

(10) Patent No.: US 10,498,385 B2
(45) Date of Patent: Dec. 3, 2019

(54) TRANCEIVER CIRCUIT AND RECEIVER CIRCUIT

(71) Applicants: SK hynix Inc., Gyeonggi-do (KR); Seoul National University R&DB Foundation, Seoul (KR)

(72) Inventors: Deog-Kyoon Jeong, Seoul (KR); Han-Gon Ko, Seoul (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/864,092

(22) Filed: Jan. 8, 2018

(65) Prior Publication Data

US 2018/0343028 A1 Nov. 29, 2018

(30) Foreign Application Priority Data

May 24, 2017 (KR) .................. 10-2017-0064153

(51) Int. Cl.
| | |
|---|---|
| H04B 1/48 | (2006.01) |
| H03K 3/356 | (2006.01) |
| H03K 17/687 | (2006.01) |
| H03K 19/0185 | (2006.01) |
| H04L 25/02 | (2006.01) |

(52) U.S. Cl.
CPC .......... *H04B 1/48* (2013.01); *H03K 3/356113* (2013.01); *H03K 17/6872* (2013.01); *H03K 19/018521* (2013.01); *H04L 25/0264* (2013.01)

(58) Field of Classification Search
CPC ..... H04B 1/48; H04L 25/026; H04L 25/0278; H04L 5/1461
See application file for complete search history.

(56) References Cited

U.S. PATENT DOCUMENTS

| | | | |
|---|---|---|---|
| 6,690,191 B2 | 2/2004 | Wu et al. | |
| 8,446,173 B1 * | 5/2013 | Faucher | H03K 19/00361 326/27 |
| 8,896,354 B1 * | 11/2014 | Hong | H03K 19/00 327/108 |
| 2005/0046442 A1 * | 3/2005 | Song | H04L 25/0278 326/30 |

(Continued)

FOREIGN PATENT DOCUMENTS

| | | |
|---|---|---|
| KR | 100543907 | 1/2006 |
| KR | 1020120005829 | 1/2012 |

OTHER PUBLICATIONS

Bashirullah, R. et al., A 16 Gb/s Adaptive Bandwidth On-Chip Bus Based on Hybrid Current/Voltage Mode Signaling, IEEE Journal of Solid-State Circuits, vol. 41, No. 2, pp. 461-473, Feb. 2006.

(Continued)

*Primary Examiner* — Ross Varndell
(74) *Attorney, Agent, or Firm* — IP & T Group LLP

(57) ABSTRACT

A transceiver circuit may include: a first NMOS transistor suitable for pulling up a transmission line in response to a TX signal in a TX mode and for being turned on or off according to a voltage level of the transmission line in an RX mode; and a first PMOS transistor suitable for pulling down the transmission line in response to the TX signal in the TX mode and for being turned on or off according to the voltage level of the transmission line in the RX mode.

4 Claims, 4 Drawing Sheets

(56) References Cited

U.S. PATENT DOCUMENTS

2005/0218927 A1* 10/2005 Shaikh ................ H04L 25/0278
326/30
2011/0001510 A1* 1/2011 Kim ................... H03K 19/0005
326/30
2016/0329887 A1* 11/2016 Kwon ................ H03K 19/0185

OTHER PUBLICATIONS

Lee, S. et al., Current-Mode Transceiver for Silicon Interposer Channel, IEEE Journal of Solid-State Circuits, vol. 49, No. 9, pp. 2044-2053, Sep. 2014.

* cited by examiner

TRANCEIVER CIRCUIT AND RECEIVER CIRCUIT

CROSS-REFERENCE TO RELATED APPLICATIONS

The present application claims priority of Korean Patent Application No. 10-2017-0064153, filed on May 24, 2017, which is incorporated herein by reference in its entirety.

BACKGROUND

1. Field

The present disclosure relates to a transceiver circuit for transmitting and receiving signals (data) in various integrated circuits.

2. Description of the Related Art

A variety of integrated circuits do not independently operate, but operate by exchanging signals (data) with surrounding chips. For example, memory chips such as a DRAM and Flash memory may not only exchange data with a memory controller, but also exchange data with a CPU and various chips on the mother board. Further, signal transmission is not only performed between chips (chip-to-chip signal transmission), but also performed between circuits A and B in one integrated circuit chip ("A" and "B" represent any circuit components included in one integrated circuit chip).

SUMMARY

Various embodiments are directed to a transceiver circuit having a function of transmitting and receiving signals In an embodiment, a transceiver circuit may include: a first NMOS transistor suitable for pulling up a transmission line in response to a TX (transmit) signal in a TX mode and for being turned on or off according to a voltage level of the transmission line in an RX (receive) mode; and a first PMOS transistor suitable for pulling down the transmission line in response to the TX signal in the TX mode and for being turned on or off according to the voltage level of the transmission line in the RX mode.

The TX signal may be transferred to the gate of the first NMOS transistor and the gate of the first PMOS transistor in the TX mode, a first bias voltage may be applied to the gate of the first NMOS transistor, and a second bias voltage may be applied to the gate of the first PMOS transistor, in the RX mode.

The transceiver circuit may further include: a second PMOS transistor suitable for pulling up a pre-RX signal in response to a drain voltage of the first NMOS transistor; and a second NMOS transistor suitable for pulling down the pre-RX signal in response to the drain voltage of the first PMOS transistor.

The transceiver circuit may further include an inverter suitable for inverting the pre-RX signal and outputting the inverted signal as an RX signal.

In the RX mode, the first PMOS transistor may be turned on when the voltage level of the transmission line is raised, and the first NMOS transistor may be turned on when the voltage level of the transmission line is lowered.

In an embodiment, a receiver circuit may include: a first resistor coupled between a pull-up voltage terminal and a first node; a first NMOS transistor having a gate configured to receive a first bias voltage, a drain coupled to the first node, and a source coupled to a transmission line; a first PMOS transistor having a gate configured to receive a second bias voltage, a drain coupled to a second node, and a source coupled to the transmission line; and a second resistor coupled between a pull-down voltage terminal and the second node.

The receiver circuit may further include: a second PMOS transistor suitable for pulling up a pre-RX signal in response to a voltage of the first node; and a second NMOS transistor suitable for pulling down the pre-RX signal in response to a voltage of the second node.

The receiver circuit may further include an inverter suitable for inverting the pre-RX signal and outputting the inverted signal as an RX signal.

When a high level signal is received from the transmission line, the first PMOS transistor may be turned on, and the first NMOS transistor may be turned off, and when a low level signal is received from the transmission line, the first NMOS transistor may be turned on, and the first PMOS transistor may be turned off.

In an embodiment, a transceiver circuit may include: a resistor coupled between a pull-up voltage terminal and a first node and suitable for being bypassed in a TX mode; a first NMOS transistor suitable for receiving a TX signal through a gate thereof in the TX mode and receiving a first bias voltage at the gate thereof in an RX mode, and having a drain coupled to the first node and a source coupled to a transmission line; a second NMOS transistor suitable for maintaining a turn-on state in the TX mode and receiving a voltage of the transmission line through a gate thereof in the RX mode, and having a drain coupled to the transmission line and a source coupled to a second node; and a third NMOS transistor suitable for receiving an inverted signal of the TX signal through a gate thereof in the TX mode and receiving a second bias voltage through the gate thereof in the RX mode, and having a drain coupled to the second node and a source coupled to a pull-down voltage terminal.

When a high level signal is received from the transmission line in the RX mode, the first NMOS transistor may be turned off, and the second NMOS transistor may be turned on, and when a low level signal is received from the transmission line in the RX mode, the first NMOS transistor may be turned on, and the second NMOS transistor may be turned off.

The transceiver circuit may further include: a current source suitable for supplying a current to the pre-RX node; a fourth NMOS transistor suitable for sinking a current from the pre-RX node in response to a voltage of the first node; and an inverter suitable for inverting a signal of the pre-RX node and outputting the inverted signal as an RX signal.

In an embodiment, a receiver circuit may include: a resistor coupled between a pull-up voltage terminal and a first node; a first NMOS transistor having a gate configured to receive a first bias voltage, a drain coupled to the first node, and a source coupled to a transmission line; and a second NMOS transistor suitable for receiving a voltage of the transmission line through a gate thereof, and pulling down the transmission line in response to the voltage of the transmission line.

The receiver circuit may further include a third NMOS transistor suitable for controlling the amount of current sunk by the second NMOS transistor according to control of the second bias voltage.

The receiver circuit may further include: a current source suitable for supplying a current to the pre-RX node; a fourth NMOS transistor suitable for sinking a current from the pre-RX node in response to a voltage of the first node; and an inverter suitable for inverting a signal of the pre-RX node and outputting the inverted signal as an RX signal.

When a high level signal is received from the transmission line, the first NMOS transistor may be turned off, and the second NMOS transistor may be turned on, and when a low level signal is received from the transmission line, the first NMOS transistor may be turned on, and the second NMOS transistor may be turned off.

DETAILED DESCRIPTION

Figure 1:
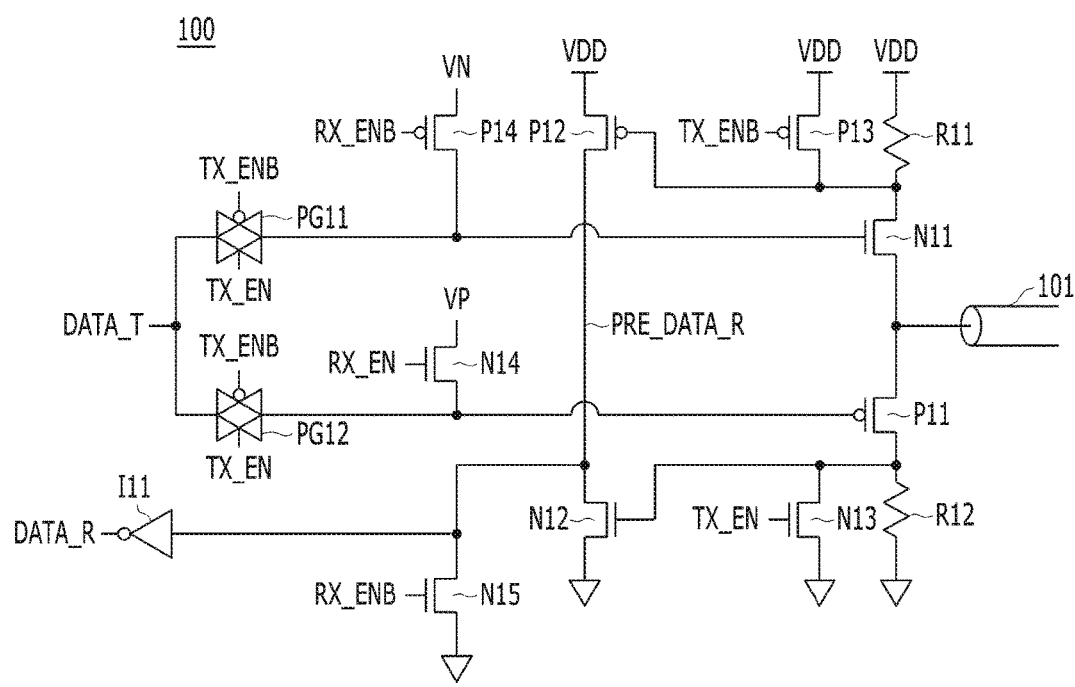
FIG. 1 is a configuration diagram of a transceiver circuit in accordance with one exemplary embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a configuration diagram of a transceiver circuit 100 in accordance with one exemplary embodiment.

A first NMOS transistor N11 and a first PMOS transistor P11 may be used to transmit data (signal) to a transmission line 101, and receive data (signal) from the transmission line 101. When 'high' data is transmitted to the transmission line 101, the transmission line may be pulled up to 'high' level by the first NMOS transistor N11, and when 'low' data is transmitted to the transmission line 101, the transmission line may be pulled down to 'low' level by the first PMOS transistor P11. Furthermore, when 'high' level data is received from the transmission line 101, the first PMOS transistor P11 may be turned on to notify that the high data is received, and when 'low' level data is received from the transmission line 101, the first NMOS transistor N11 may be turned on to notify that the low data is received. That is, the main operations of the data transmitting/receiving process may be performed by the first NMOS transistor N11 and the first PMOS transistor P11.

A first pass gate PG11 and a second pass gate PG12 may transfer TX (transmit) data DATA_T to the gate of the first NMOS transistor N11 and the gate of the first PMOS transistor P11 in a TX mode in which TX signals TX_EN and TX_ENB are activated to high and low levels, respectively. A fourth PMOS transistor P14 and a fourth NMOS transistor N14 may apply a first bias voltage VN and a second bias voltage VP to the gate of the first NMOS transistor N11 and the gate of the first PMOS transistor P11 in an RX (receive) mode in which RX signals RX_EX and RX_ENB are activated to high and low levels, respectively.

A first resistor R11 may be coupled between the drain of the first NMOS transistor N11 and a pull-up voltage terminal VDD, and a second resistor R12 may be coupled between the drain of the first PMOS transistor P11 and a pull-down voltage terminal (ground voltage terminal). The first and second resistors R11 and R12 may be used for a receiving operation. During the receiving operation, the first resistor R11 may cause a voltage drop when the first NMOS transistor N11 is turned on, and the second resistor R12 may cause a voltage drop when the first PMOS transistor P11 is turned on. A third PMOS transistor P13 and a third NMOS transistor N13 may bypass the first resistor R11 and the second resistor R12 in the TX mode in which the TX signals TX_EN and TX_ENB are activated to high and low levels, respectively.

A second PMOS transistor P12 may pull up the node of pre-RX data PRE_DATA_R in response to the voltage of the drain of the first NMOS transistor N11 in the RX mode, and a second NMOS transistor N12 may pull down the node of pre-RX data PRE_DATA_R in response to the voltage of the drain of the first PMOS transistor P11 in the RX mode. An inverter I11 may invert the pre-RX data PRE_DATA_R, and output the inverted data as RX data DATA_R. When the current mode is not the RX mode, a fifth NMOS transistor N15 may pull down the node of the pre-RX data PRE_DATA_R and prevent the pre-RX data PRE_DATA_R from floating.

In the transceiver circuit 100 of FIG. 1, the main operations of the data transmitting/receiving process may be performed by the first NMOS transistor N11 and the first PMOS transistor P11. Since the first NMOS transistor N11 and the first PMOS transistor P11 directly transmit data to the transmission line 101 or directly receive data from the transmission line 101, the first NMOS transistor N11 and the first PMOS transistor P11 need to be large in size. Since the elements P11 and N11, which occupies large space in the transceiver circuit 100, are designed to be used for transmitting and receiving signals in common, the area of the transceiver circuit 100 can be significantly reduced.

Figure 2:
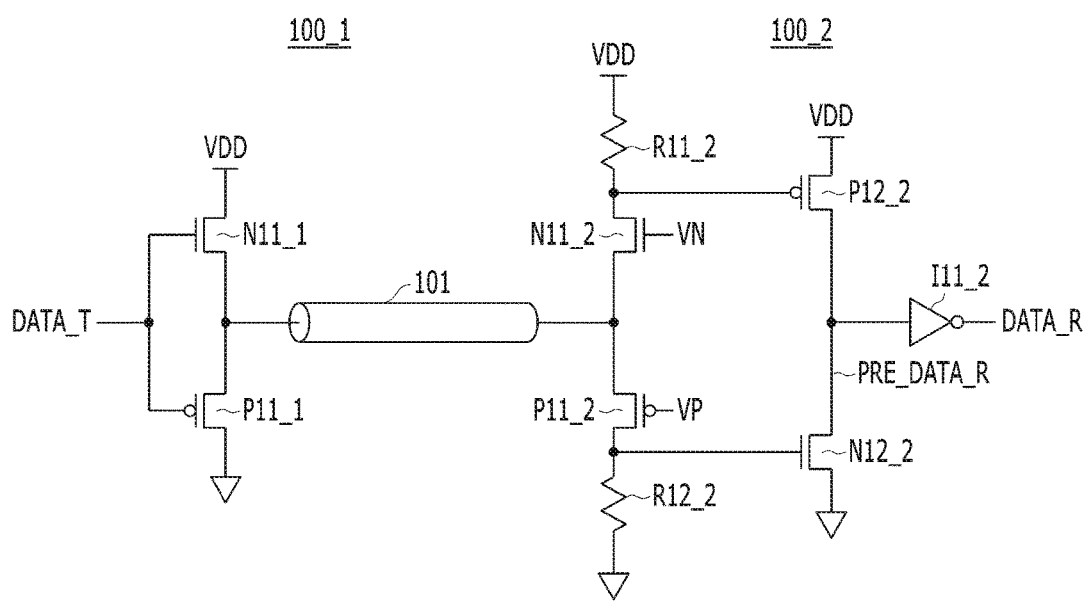
FIG. 2 illustrates that the transceiver circuit of FIG. 1 is operated in a TX mode and an RX mode.

FIG. 2 illustrates that the transceiver circuit 100 of FIG. 1 is operated in the TX mode and the RX mode. The left side of the diagram 100_1 of FIG. 2 illustrates a connection state when the transceiver circuit 100 is in the TX mode, and the right side of the diagram 100_2 of FIG. 2 illustrates a connection state when the transceiver circuit 100 is in the RX mode. In order to distinguish the left and right circuits from each other, the left circuit has a reference numeral with _1, and the right circuit has a reference numeral with _2.

First, an operation in which 'high' level data is transmitted from the left circuit 100_1 to the right circuit 100_2 will be described. When the TX data DATA_T is 'high', the first NMOS transistor N11_1 of the left circuit 100_1 may be turned on and the first PMOS transistor P11_1 may be turned off, in response to the TX data DATA_T. Since the transmission line 101 is pulled up by the first NMOS transistor N11_1, the transmission line 101 may be changed to 'high' level. At this time, the high level of the transmission line 101 may correspond to VDD−Vth.n, where Vth.n represents the threshold voltage of the first NMOS transistor N11_1.

When the transmission line 101 is at 'high' level, the source voltage of the first PMOS transistor P11_2 of the right circuit 100_2 may be raised. Thus, the first PMOS transistor P11_2 may be turned on. On the other hand, since the source voltage of the first NMOS transistor N11_2 is raised, the first NMOS transistor N11_2 may be turned off. Since the first PMOS transistor P11_2 is turned on, a current may flow to the second resistor R12_2 to raise the drain voltage of the first PMOS transistor P11_2. In response to the drain voltage of the first PMOS transistor P11_2, the second NMOS transistor N12_2 may be turned on to change the pre-RX data PRE_DATA_R to 'low' level, and the RX data DATA_R from the inverter I11_2 may be outputted at 'high' level.

Now, an operation in which 'low' data is transmitted from the left circuit 100_1 to the right circuit 100_2 will be described. When the TX data DATA_T is 'low', the first PMOS transistor P11_1 of the left circuit 100_1 may be turned on and the first NMOS transistor N11_1 may be turned off, in response to the TX data DATA_T. Since the transmission line 101 is pulled down by the first PMOS transistor P11_1, the transmission line 101 may be changed to 'low' level. The low level of the transmission line 101 may correspond to Vth.p, where Vth.p represents the threshold voltage of the first PMOS transistor P11_1.

When the transmission line 101 is at 'low' level, the source voltage of the first NMOS transistor N11_2 of the right circuit 100_2 may be lowered. Thus, the first NMOS transistor N11_2 may be turned on. On the other hand, since the source voltage of the first PMOS transistor P11_2 is lowered, the first PMOS transistor P11_2 may be turned off. Since the first NMOS transistor N11_2 is turned on, a current may flow to the first resistor R11_2, and the drain voltage of the first NMOS transistor N11_2 may be lowered by a voltage drop. In response to the drain voltage of the first NMOS transistor N11_2, the second PMOS transistor P12_2 may be turned on to change the pre-RX data PRE_DATA_R to 'high' level, and the RX data DATA_R from the inverter I11_2 may be outputted at 'low' level.

The second bias voltage VP may be set to turn on the first PMOS transistor P11_2 when the voltage of the transmission line 101 is at 'high' level. That is, the condition of VDD−Vth.n>VP+Vth.p may be satisfied, where Vth.p represents the threshold voltage of the first PMOS transistor P11_2. Further, the second bias voltage VP may be set to turn off the first PMOS transistor P11_2 when the voltage of the transmission line 101 is at 'low' level. That is, the condition of Vth.n<VP+Vth.p may be satisfied. The first bias voltage VN may be set to turn off the first NMOS transistor N11_2 when the voltage of the transmission line 101 is at 'high' level. That is, the condition of VN<VDD may be satisfied. Further, the first bias voltage VN may be set to turn on the first NMOS transistor N11_2 when the voltage of the transmission line 101 is at 'low' level. That is, the condition of VN>Vth.n+Vth.p may be satisfied.

The TX data DATA_T and the RX data DATA_R may swing fully from 0 to VDD, but the data transmitted through the transmission line 101 may swing from Vth.n to VDD−Vth.p, which makes it possible to reduce current consumption required for the transceiver circuit 100 to transmit and receive data.

FIG. 2 illustrates the circuit 100_1 when the transceiver circuit 100 is set in the TX mode and the circuit 100_2 when the transceiver circuit 100 is set in the RX mode. A transmitter circuit to perform only a transmitting operation regardless of a mode change may be configured as the circuit 100_1, and a receiver circuit to perform only a receiving operation regardless of a mode change may be configured as the circuit 100_2.

Figure 3:
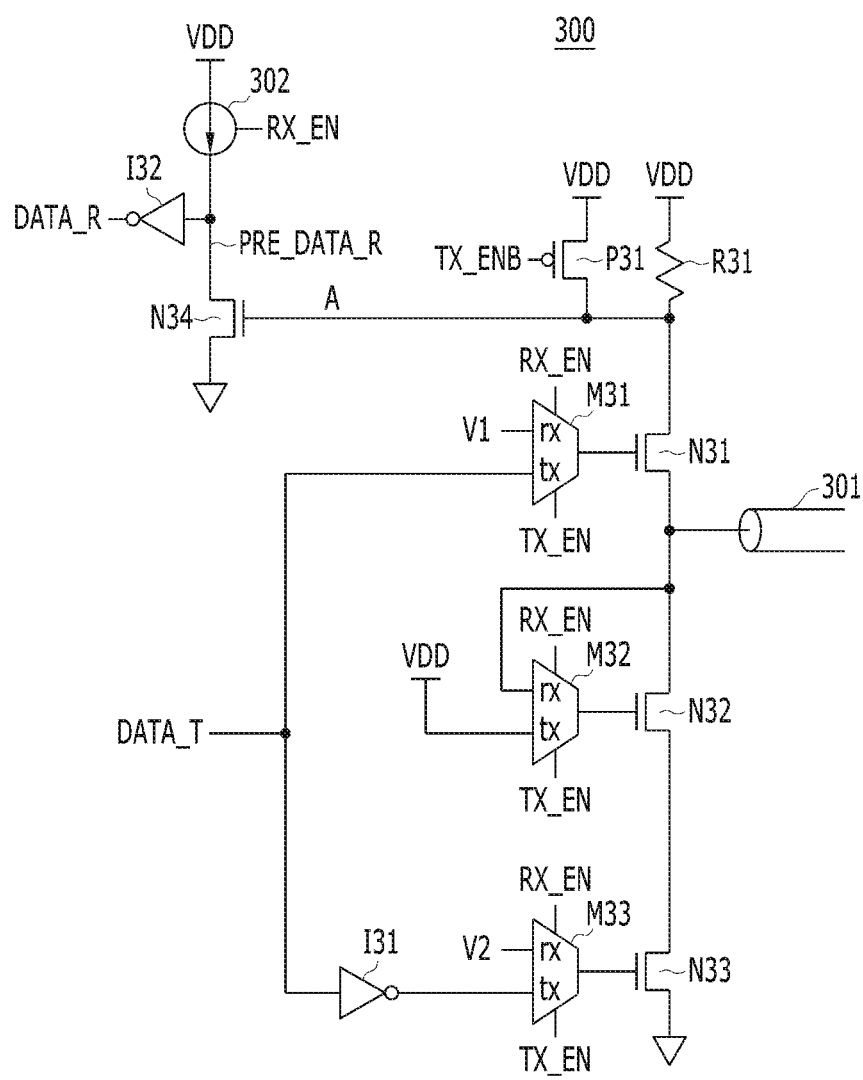
FIG. 3 is a configuration diagram of a transceiver circuit in accordance with one exemplary embodiment.

FIG. 3 is a configuration diagram of a transceiver circuit 300 in accordance with one exemplary embodiment.

A first NMOS transistor N31, a second NMOS transistor P32, and a third NMOS transistor N33 may be used to transmit data (signal) to a transmission line 301 and receive data (signal) from the transmission line 301. When 'high' level data is transmitted to the transmission line 301, the transmission line 301 may be pulled up to 'high' level by the first NMOS transistor N31, and when 'low' data is transmitted to the transmission line 301, the transmission line 301 may be pulled down to 'low' level by the second and third NMOS transistors N32 and N33. Further, when 'high' level data is received from the transmission line 301, the second and third NMOS transistors N32 and N33 may be turned on to notify that the high data is received, and when 'low' level data is received from the transmission line 301, the first NMOS transistor N31 may be turned on to notify that the low data is received. That is, the main operations of the data transmitting/receiving process may be performed by the first NMOS transistor N31, the second NMOS transistor N32, and the third NMOS transistor P33.

A first multiplexer M31 may transfer TX data DATA_T to the gate of the first NMOS transistor N31 in the TX mode in which a TX signal TX_EN is activated to 'high' level, and apply a first bias voltage V1 to the gate of the first NMOS transistor N31 in the RX mode in which an RX signal RX_EN is activated to 'high' level. A second multiplexer M32 may apply a pull-up voltage VDD to the gate of the second NMOS transistor N32 in the TX mode, and electrically couple the gate of the second NMOS transistor N32 to the transmission line 301 in the RX mode. A third multiplexer M33 may transfer inverted TX data DATA_TB to the gate of the third NMOS transistor N33 in the TX mode, the inverted TX data DATA_TB being generated by inverting the TX data DATA_T through a first inverter 131, and apply a second bias voltage V2 to the gate of the third NMOS transistor N33 in the RX mode.

A resistor R31 may be coupled between the pull-up voltage terminal VDD and a first node A. The resistor R31 may be used during a receiving operation. When the first NMOS transistor N31 is turned on during the receiving operation, a voltage drop may be caused by the resistor R31. In the TX mode, the first PMOS transistor P31 may be turned on to bypass the resistor R31.

A current source 302, a fourth NMOS transistor N34, and a second inverter I32 may generate RX data DATA_R using the voltage level of the first node A. The current source 302 may be enabled in the RX mode and supply a current to a pre-RX node PRE_DATA_R to which pre-RX data is loaded, and the fourth NMOS transistor N34 may sink a current from the pre-RX node PRE_DATA_R in response to the voltage of the first node A. The second inverter I32 may invert the signal of the pre-RX node PRE_DATA_R and output the inverted signal as the RX data DATA_R.

In the transceiver circuit 300 of FIG. 3, the main operations of the data transmitting/receiving process may be performed by the first to third NMOS transistors N31 to N33. Since the first to third NMOS transistors N31 to N33 may directly transmit data to the transmission line 301 or directly receive data from the transmission line 301, the first to third NMOS transistors N31 to N33 need to occupy large space in the transceiver circuit 300. When the elements N31 to N33, which need to large in size, are designed to be used for transmitting and receiving signals in common, the area of the transceiver circuit 300 can be significantly reduced.

Figure 4:
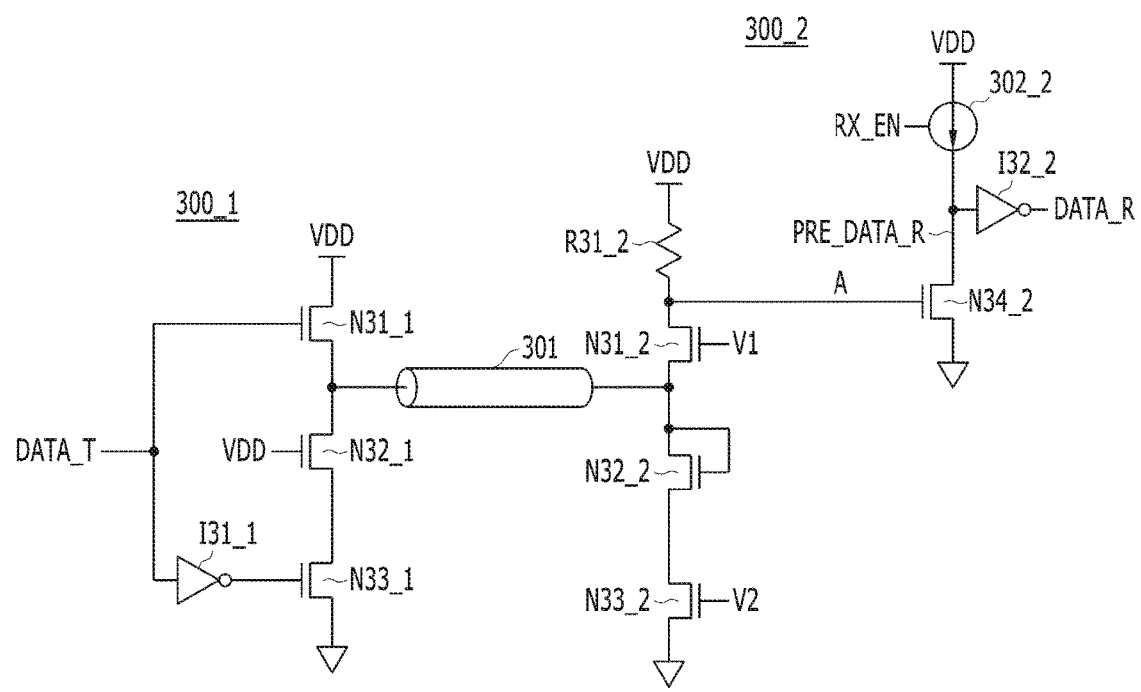
FIG. 4 illustrates that the transceiver circuit of FIG. 3 is operated in the TX mode and the RX mode

FIG. 4 illustrates that the transceiver circuit 300 of FIG. 3 is operated in the TX mode and the RX mode. The left diagram 300_1 of FIG. 4 illustrates a connection state when the transceiver circuit 300 is in the TX mode, and the right diagram 300_2 of FIG. 4 illustrates a connection state when the transceiver circuit 300 is in the RX mode. In order to distinguish the left side and right side circuits from each other, the left side circuit has reference numerals with _1, and the right side circuit has reference numerals with _2.

First, an operation in which 'high' level data is transmitted from the left side circuit 300_1 to the right side circuit 300_2 will be described. When the TX data DATA_T is 'high', the first NMOS transistor N31_1 of the left side circuit 300_1 may be turned on and the third NMOS transistor N31_1 may be turned off, in response to the TX data DATA_T. Since the transmission line 301 is pulled up by the first NMOS transistor N31_1, the transmission line 101 may be changed to 'high' level. The high level of the transmission line 301 may correspond to VDD−Vth.n, where Vth.n represents the threshold voltage of the first NMOS transistor N31_1.

When the transmission line 301 is at 'high' level, the second NMOS transistor N32_2 of the right side circuit 300_2 may be turned on, and the first NMOS transistor N31_2 may be turned off. At this time, since the third NMOS transistor N33_2 receives the second bias voltage V2, the third NMOS transistor N33_2 may maintain a turn-on state. That is, a current supplied to the transmission line 301 by the first NMOS transistor N31_1 of the left side circuit 300_1 may flow to the ground terminal through the second and third NMOS transistors N32_2 and N33_2 of the right side circuit 300_2. On the other hand, since the first NMOS transistor N31_2 of the right side circuit is turned off, no current may flow to the resistor R_2, and no voltage drop may occur. Thus, since the level of the first node A is set to the level of the pull-up voltage VDD, and the fourth transistor N34_2 is turned on according to the voltage at the first node A, the level of the pre-RX node PRE_DATA_R may be lowered. As a result, the RX data DATA_R having 'high' level may be outputted to the second inverter I32_2.

Further, an operation in which 'low' level data is transmitted from the left side circuit 300_1 to the right side circuit 300_2 will be described. When the TX data DATA_T is 'low', the third NMOS transistor N33_1 of the left side circuit 300_1 may be turned on, and the first NMOS transistor N31_1 may be turned off, in response to the TX data DATA_T. At this time, since the second NMOS transistor N32_1 also maintains a turn-on state, the transmission line 301 may be pulled down by the second and third NMOS transistors N32_1 and N33_1 and set to 'low' level. At this time, since the transmission line 301 is pulled down by the two NMOS transistors N32_1 and N33_1, the transmission line 301 may be set to almost the same level as the level of the ground voltage.

When the transmission line 301 is at 'low' level, the first NMOS transistor N31_2 of the right side circuit 300_2 may be turned on, and the second NMOS transistor N33_2 may be turned off. Since the first NMOS transistor N31_2 is turned on, a current may flow through the resistor R_2. Then, a voltage drop may occur across the resistor R_2, the level of the first node A_2 may be changed to 'low' level, and the fourth transistor N34_2 may be turned off in response to the first node A_2. Thus, the pre-RX node PRE_DATA_R may retain 'high' level, and the RX data DATA_R having 'low' level may be outputted to the second inverter I32_2.

The level of the first bias voltage V1 may be adjusted to a proper level such that the first NMOS transistor N31-2 can be turned off when the transmission line 301 is at 'high' level, and the first NMOS transistor N31_2 can be turned on when the transmission line 301 is at 'low' level. The second bias voltage V2 may be adjusted to a proper level in order to properly adjust the amount of current flowing to the third NMOS transistor N33_2.

In the transceiver circuit 300 of FIG. 3, a signal on the transmission line 301 may have a larger swing than in the transceiver circuit 100 of FIG. 1. Thus, the transceiver circuit 300 can be operated even when the supply voltage VDD is lower than in the transceiver circuit 100 of FIG. 1.

FIG. 4 illustrates the circuit 300_1 when the transceiver circuit 300 is set in the TX mode and the circuit 3002 when the transceiver circuit 300 is set in the RX mode. A transmitter circuit to perform only a transmitting operation regardless of a mode change may be configured as the circuit 300_1, and a receiver circuit to perform only a receiving operation regardless of a mode change may be configured as the circuit 300_2.

In accordance with the present embodiments, the transceiver circuit can transmit/receive a signal using the same elements.

Although various embodiments have been described for illustrative purposes, it will be apparent to those skilled in the art that various changes and modifications may be made without departing from the spirit and scope of the invention as defined in the following claims.

What is claimed is:
1. A transceiver circuit comprising:
a first NMOS transistor suitable for pulling up a transmission line in response to a transmit (TX) signal in a TX mode and for being turned on or off according to a voltage level of the transmission line in a receive (RX) mode;
a first PMOS transistor suitable for pulling down the transmission line in response to the TX signal in the TX mode and for being turned on or off according to the voltage level of the transmission line in the RX mode;
a first resistor coupled between a drain of the first NMOS transistor and a pull-up voltage terminal; and
a second resistor coupled between a drain of the first PMOS transistor and a pull-down voltage terminal,
wherein the TX signal is transferred to the gate of the first NMOS transistor and the gate of the first PMOS transistor in the TX mode,
a first bias voltage is applied to the gate of the first NMOS transistor, and a second bias voltage is applied to the gate of the first PMOS transistor, in the RX mode, and
the first and second resistors are bypassed in the TX mode.
2. The transceiver circuit of claim 1, further comprising:
a second PMOS transistor suitable for pulling up a pre-RX signal based on a drain voltage of the first NMOS transistor; and
a second NMOS transistor suitable for pulling down the pre-RX signal based on the drain voltage of the first PMOS transistor.
3. The transceiver circuit of claim 2, further comprising an inverter suitable for inverting the pre-RX signal and outputting the inverted signal as an RX signal.
4. The transceiver circuit of claim 2, wherein in the RX mode, the first PMOS transistor is turned on when the voltage level of the transmission line is raised, and the first NMOS transistor is turned on when the voltage level of the transmission line is lowered.

* * * * *